(12) United States Patent
Boerstler et al.

(10) Patent No.: US 7,061,284 B2
(45) Date of Patent: Jun. 13, 2006

(54) HIGH FREQUENCY DIVIDER STATE CORRECTION CIRCUIT WITH DATA PATH CORRECTION

(75) Inventors: David William Boerstler, Round Rock, TX (US); Eric John Lukes, Stewartville, MN (US); Hiroki Kihara, Austin, TX (US); James David Strom, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/850,402

(22) Filed: May 20, 2004

(65) Prior Publication Data

US 2005/0262407 A1  Nov. 24, 2005

(51) Int. Cl.
*H03K 21/00* (2006.01)
*H03K 23/00* (2006.01)
*H03K 25/08* (2006.01)

(52) U.S. Cl. .................. 327/115; 327/117; 377/47; 377/48

(58) Field of Classification Search ............. None
See application file for complete search history.

(56) References Cited

U.S. PATENT DOCUMENTS

| 3,530,284 | A | | 9/1970 | Wood .................. 377/28 |
| 3,609,391 | A | * | 9/1971 | Hatano et al. ............ 327/176 |
| 4,442,748 | A | * | 4/1984 | Kaneko et al. ............ 84/648 |
| 4,691,331 | A | * | 9/1987 | Bayruns et al. ............ 377/47 |
| 4,993,051 | A | | 2/1991 | Feldbrugge .............. 377/28 |
| 5,339,345 | A | * | 8/1994 | Mote, Jr. ................ 377/48 |
| 6,531,903 | B1 | * | 3/2003 | Wichman ................ 327/117 |
| 6,826,250 | B1 | * | 11/2004 | Groo ..................... 377/47 |
| 2002/0114422 | A1 | | 8/2002 | Masahiko ............... 377/119 |

* cited by examiner

*Primary Examiner*—Tuan T. Lam
(74) *Attorney, Agent, or Firm*—Carr LLP; Diana R. Gerhardt

(57) ABSTRACT

The present invention provides for state correction. A first flip flop coupled to a second flip flop. A state correction circuit coupled to the output of the second flip flop. A third flip flop is coupled to the output of the state correction circuit. A fourth flip flop is coupled to the output of the third flip flop.

20 Claims, 6 Drawing Sheets

HIGH FREQUENCY DIVIDER STATE CORRECTION CIRCUIT WITH DATA PATH CORRECTION

CROSS-REFERENCED APPLICATION

This Application relates to "High Frequency Divider Circuit", AUS9200300594US1, filed concurrently herewith.

TECHNICAL FIELD

The present invention relates generally to error correction and, more particularly, to error correction in a state machine circuit.

BACKGROUND

There is a type of incrementer called a high frequency divider. In a high frequency divider, the values within the incrementer change in a predefined fashion, but not necessarily by a mathematical addition or subtraction. For instance, 000000 could be the first state, 000001 could be the second number, 000011 could be the third, 000111 could be the fourth, 001111 could be the fifth, 011111 could be the sixth, 111111 could be the seventh, 011111 could be the eighth state, and so on. The values could represent the generation of a square wave, although other uses are also possible. The particular incrementing from state value to state value is a function of the internal logic of the high frequency divider.

However, there is a problem with high frequency dividers. One such problem is if the system starts up in an invalid state. For instance, what if it starts in state 010101? This can happen when a system first powers up, as the states of the latches within the system can be indeterminate. Alternatively, a catastrophic event can happen, such as an electromagnetic pulse. If this happens, the states within the divide by 8 counter can be forced into an undesired state.

However, in conventional technology, if left uncorrected, the states could cycle from one undesired state to another undesired state, without ever becoming a desired state and getting back on track. The system can be reset, and a preloaded "seed" state can be entered into the system. However, this is time-wise an expensive proposition, and errors can creep in if the initial "seed" state is somehow inaccurate. If an electromagnetic pulse changes the state within the circuit to an invalid state or sequence. This invalid state or sequence should be deleted, which costs additional time and circuitry area, and a system reset is issued, which also costs additional time.

Therefore, there is a need to ensure that a desired state is arrived at after a certain number of state transitions in a manner that addresses at least some of the problems associated with the prior art.

SUMMARY OF THE INVENTION

The present invention provides for a state circuit. A second flip flop coupled to a first flip flop. A state correction circuit coupled to the output of the second flip flop. A third flip flop is coupled to the output of the state correction circuit. A fourth flip flop is coupled to the output of the third flip flop.

BRIEF DESCRIPTION OF THE DRAWINGS

For a more complete understanding of the present invention, and the advantages thereof, reference is now made to the following Detailed Description taken in conjunction with the accompanying drawings, in which.

DETAILED DESCRIPTION

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the relevant art.

In the remainder of this description, a processing unit (PU) may be a sole processor of computations in a device. In such a situation, the PU is typically referred to as an MPU (main processing unit). The processing unit may also be one of many processing units that share the computational load according to some methodology or algorithm developed for a given computational device. For the remainder of this description, all references to processors shall use the term MPU whether the MPU is the sole computational element in the device or whether the MPU is sharing the computational element with other MPUs, unless otherwise indicated.

It is further noted that, unless indicated otherwise, all functions described herein may be performed in either hardware or software, or some combination thereof. In a preferred embodiment, however, the functions are performed by a processor, such as a computer or an electronic data processor, in accordance with code, such as computer program code, software, and/or integrated circuits that are coded to perform such functions, unless indicated otherwise.

Figure 1A:
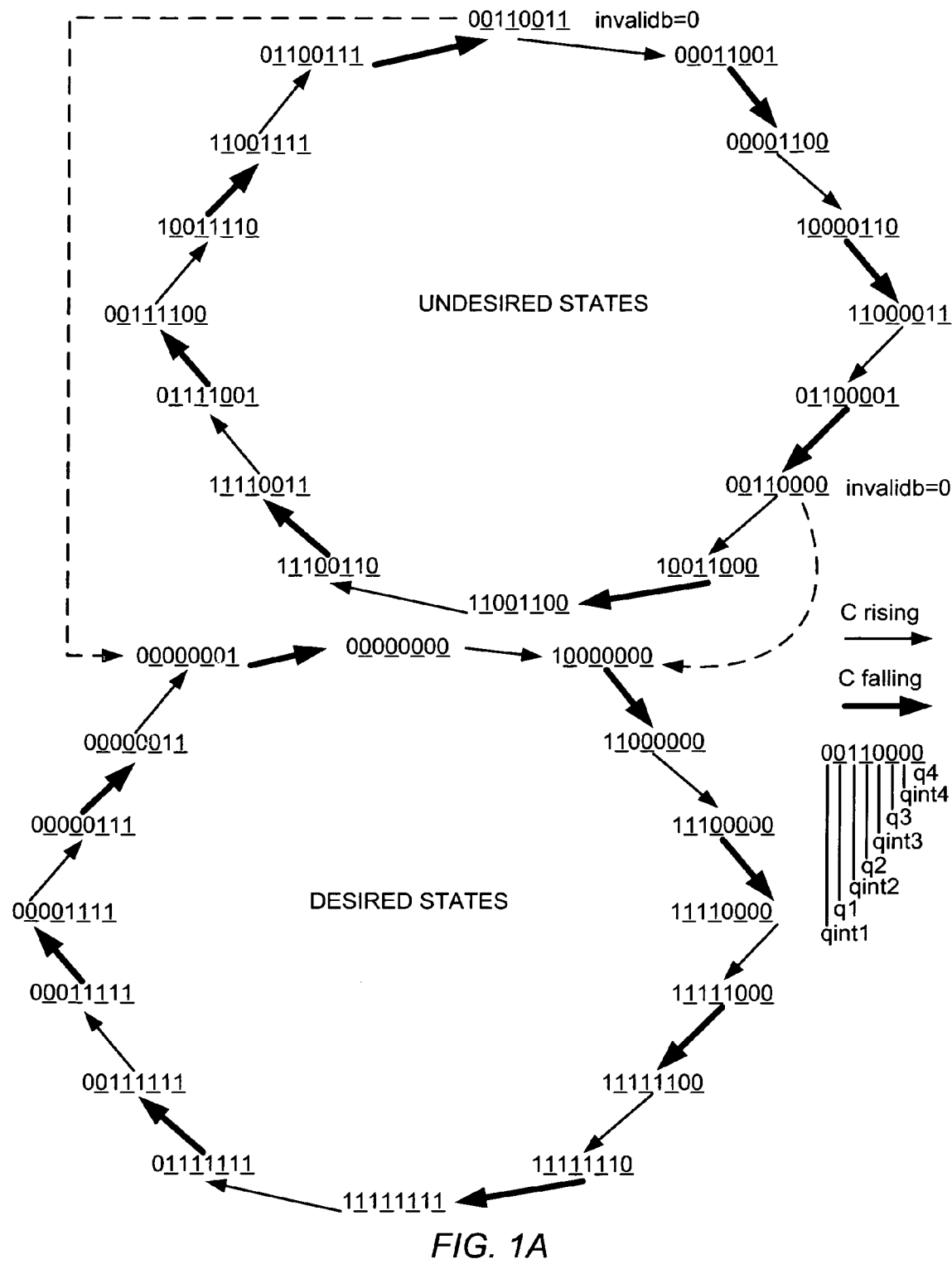
FIG. 1A schematically depicts an allowed and an unallowed divide by 8 stateflow.

Turning to FIG. 1A, disclosed is a divide by 8 stateflow diagram with allowed and unallowed states. In FIG. 1A, an unallowed stateflow transitions into an allowed stateflow after a specifically defined state or a set of states occurs. Generally, in reference to FIG. 1A, a specifically defined non-allowed state is detected, such as 00110011 or 00110000, and an internal change of a value occurs within the high frequency divider circuit, thereby kicking the state of the internal D Latch into a desired state, such as 00000001 or 10000000, instead of 00011001 or 10011000, which would have been the result in conventional technology.

For instance, in FIG. 1A, what if the undesired state of 01100111 arose at power up? By the internal logic of the circuitry (a shift right, and then invert the value shifted from rightmost bit and wrapped around the to the leftmost bit), this would become 00110011, a second unallowed state. By a similar logic, this would then transition into 00011001. However, the transition diagram of FIG. 1A addresses this problem.

Figure 1B:
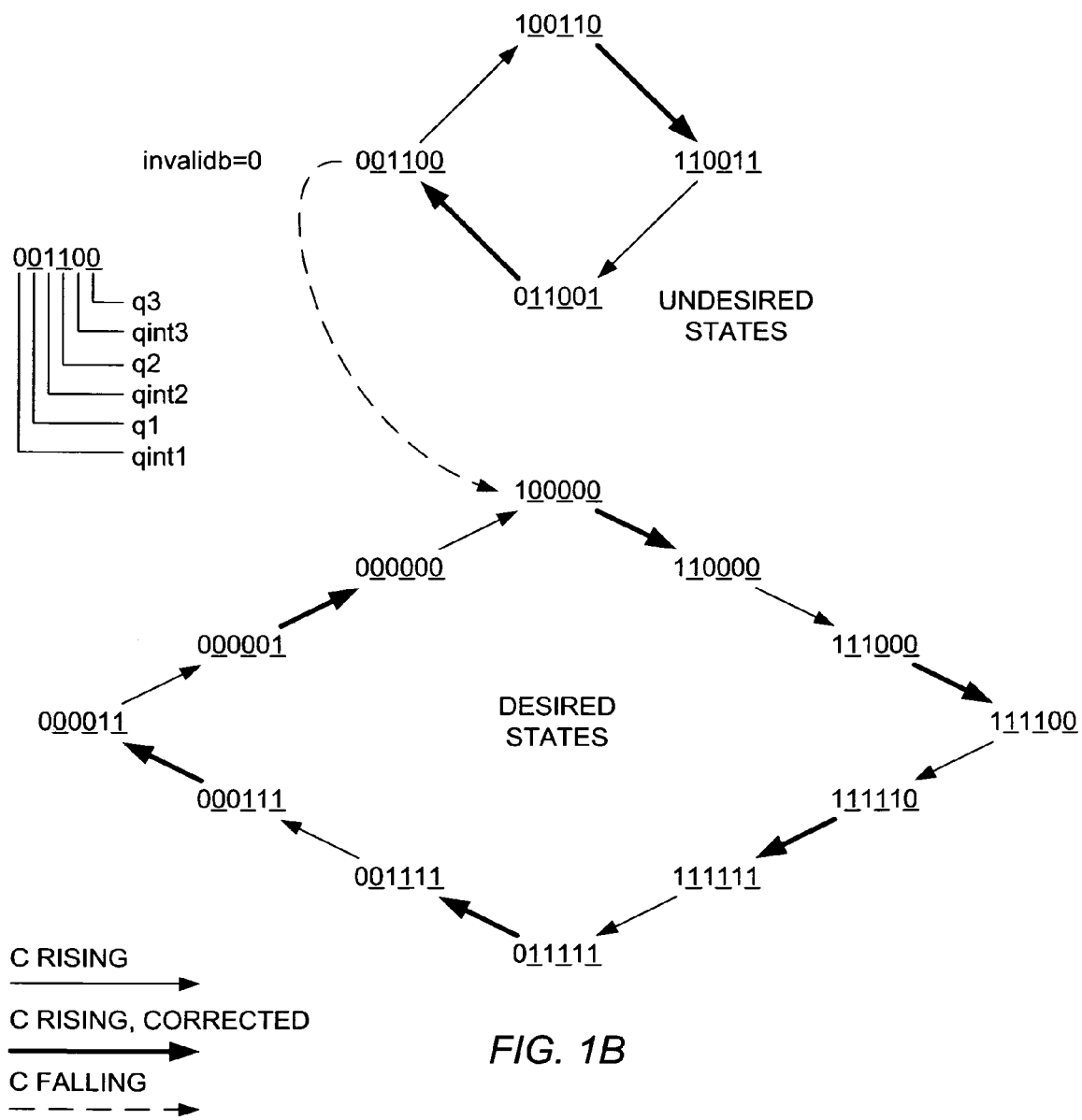
FIG. 1B schematically depicts an allowed and an unallowed divide by 6 stateflow.

Turning now to FIG. 1B, illustrated is a divide by 6 stateflow. An unallowed stateflow transitions into an allowed stateflow after a specifically defined state occurs. Generally, in reference to FIG. 1B, a specifically defined non-allowed state is detected as 001100, a circuit transitions into a allowed state 100000, instead of 100110, an unallowed state.

Figure 2:
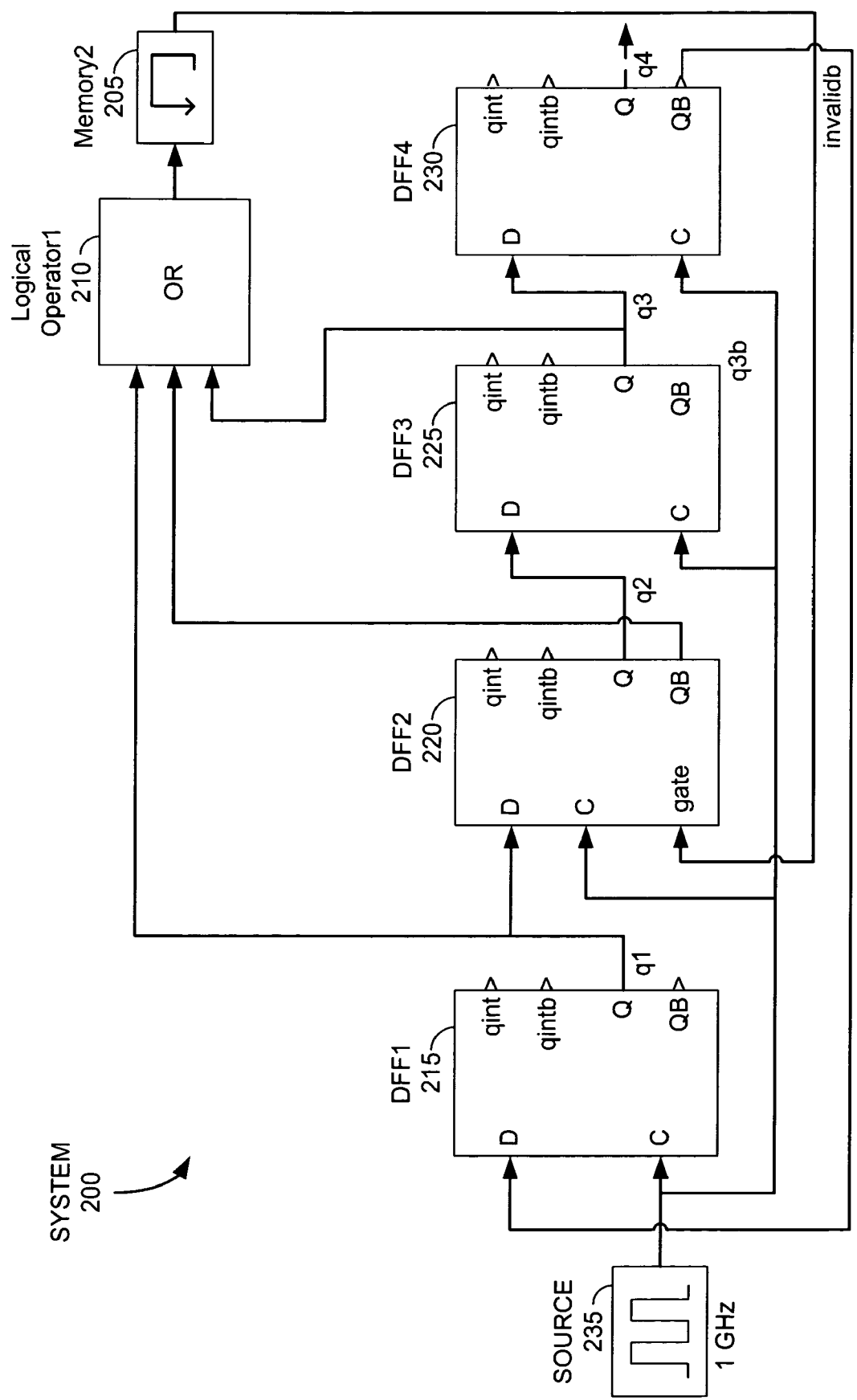
FIG. 2 illustrates a divide by 8 stateflow correction circuit with state correction.

Turning now to FIG. 2, illustrated is a divide by 8 state circuit 200. A D type flip flop (DFF) 1 215 has a clock signal input into its C input from a clock source 235. The Q output of DFF1 215 (q1 signal state) is coupled to the D input of a DFF2 220. The Q output of DFF1 220 (q2 signal state) is coupled to the D input of a DFF3 225. The Q output of DFF3 225 (q3 signal state) is coupled to the D input of a DFF4 230. The Q inverted output of DFF4 230 (q4 signal state) is fed back into and coupled coupled to the D input of a DFF2 215.

The Q states of DFF1, DFF2, DFF3 and DFF4 215, 220, 225, 230 are coupled to a logical operator 210. The logical operator 210 is coupled to a gate of the DFF2 220. In other implementations, only flip flops 215, 220 and 225 are used. Gate Memory 205 can be used to introduce a time delay. Otherwise, there could be problems with substantially simultaneous feedback, and the logic states might not converge, an error condition. This configuration enables the state transition from the undesired states to desired states of FIG. 1A.

Figure 3:
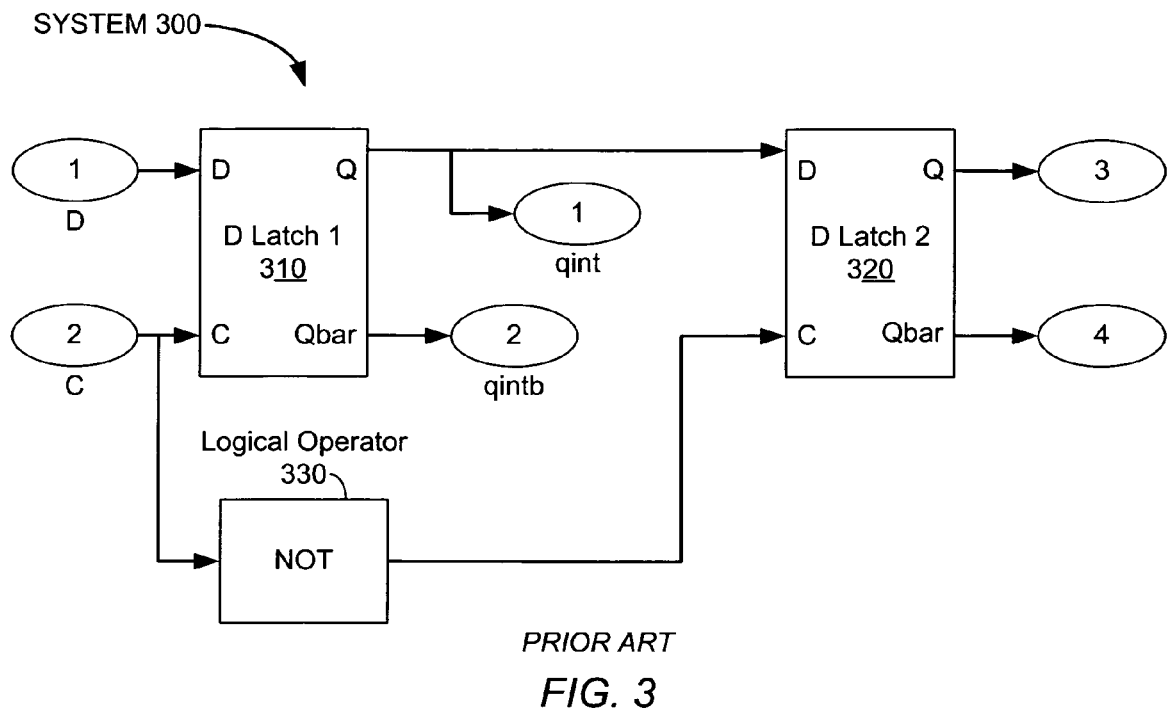
FIG. 3 illustrates a conventional D flip flop.

Turning now to FIG. 3, illustrated are the internal workings 300 of a conventional D flip flop, such as DFF1 215, DDF3 225, and DFF4 230. As is illustrated regarding a flip flop, there are two inputs, input 1 (D, for data input) and input 2 (C, for a clock input). Flip flops have applicability as memory devices. The flip flop DFF3 225 is actually comprised of 2 different latches, 310 and 320.

As is understood by those of skill in the art, if a flip-flop is enabled by a clock signal, the flip flop will pass on the signal data state from the input to the output on the data, or Q line. However, if the flip flop is disabled by a clock signal, the input D value will not be propagated to the output, and instead the previously stored D value will be output of the D input.

In FIG. 3, of DFF1 215, for instance, there are two D latches coupled in series, latch 310 and latch 320. If the input value for D is 1, and the clock value is enabled, the qint1 value is also the same as the D value, and the qintb value is the inverted value of qintB. However, due to a logical "not" operator 330, the second D latch 320 is disabled. This means that, no matter what the qint value is in this circuit, the previous qint value is what is output as the Q value. In other words, with the clock being "high", the output of DFF1 215 can not change, as it "remembers" and outputs the previous state.

However, for instance, in the next clock pulse, the input clock pulse goes "low". Therefore, the input data does not propagate from the Data input to the Q or qint output in this flip flop, and the qint value of the previous clock cycle is retained by this first D latch 310. However, because the input clock value is inverted to "high", the second flip flop propagated the qint value into the output Q, the "3" value. Hence, for the DFF1 215 to change an output state, it takes at least one full clock cycle, and it only accepts as input data states from alternating clock cycles.

Turning back to FIG. 2, this means that, for instance, the values 0<u>0000011</u> can be used in the system. On the next clock cycle, the value becomes 0<u>0000011</u>. As has been explained above, there is an internal state (qint1, qint2, qint3) etc, which is illustrated as non-underline, and a state q1, q2, q3 and so on, which is illustrated as underlined. The state changes because the inversion that occurs at the output of DFF4 230, which is fed back in as data into the D port of the DFF1 215. As is seen by the desired states transition illustrated in FIG. 1A, the states are stepped through the system, the last flip-flop inverting and transferring the inverted value back to the input.

However, if an undesired state comes up, the system 200 can work as follows. For instance, what if a conventional divide by 8 system starts as 01100111 as its starting state? A conventional system would then transition to 00110011, also an invalid state, without correction this would further transition to 0<u>0011001</u>.

However, the logic of FIG. 2 is configured to transition to 0<u>0000001</u> instead of 0<u>00111001</u>, an allowed state. In FIG. 2, the second bit of the state 00xxxxxx, is used to overwrite the next 3 bits in the state, to become 0<u>0000</u>xxx. Similarly, an invalid state of 0<u>0110000</u> transitions to 1<u>0000000</u> instead of 1<u>0011000</u>. In other words, the first output state (q1) also becomes q2 internal and q2 out and q3 internal, as will be illustrated in FIG. 1A.

The system 200 detects invalid states can be as follows. The outputs q1, q2 (inverted) and q3 are input into the OR 110. When xxxxxxxx ("x" a variable), have the values of x 0x1x0xx, the OR gate output becomes negative, the output invalidb state goes low, and there is enabled a transition from an unallowed state to an allowed state. Turning briefly to FIG. 1A, this transition happens at both 0<u>0110011</u> and 0<u>0110000</u>, as is shown in FIG 1A, and only in those states does the transition to a desired state happen.

Figure 4:
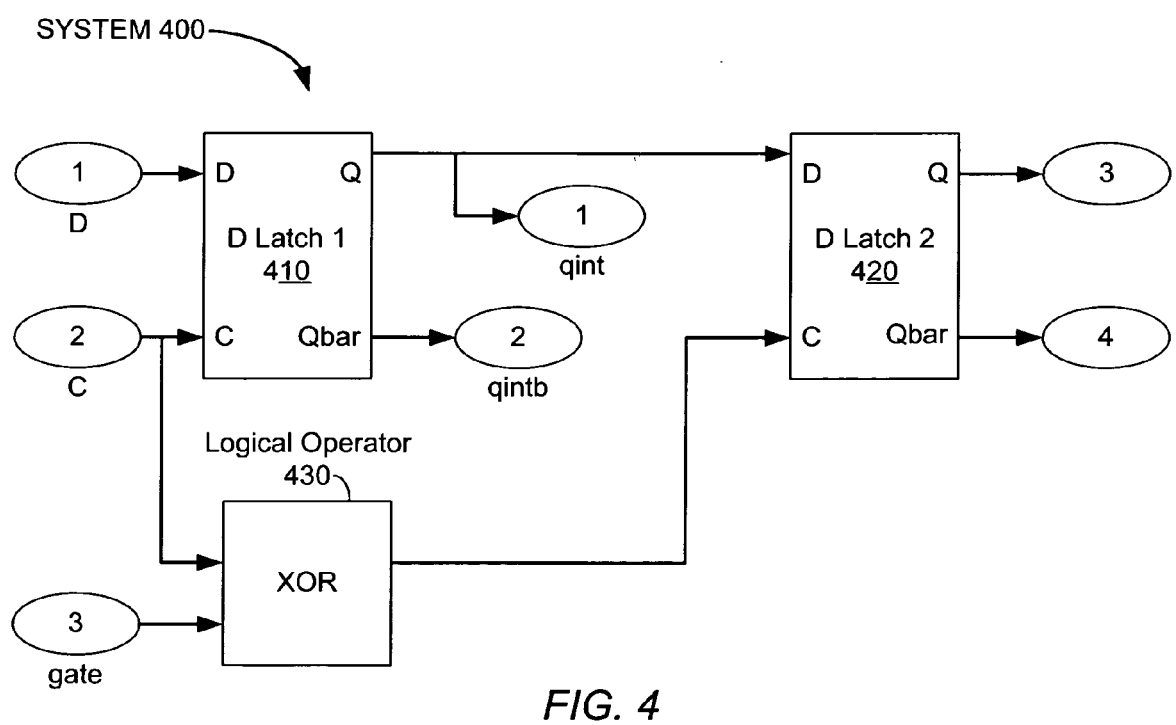
FIG. 4 illustrates a D flip flop configured for error correction.

Turning now to FIG. 4, illustrated are the internal working 400 with latches 410, 420 of DFF 220, the flip flop in which state transitions occur when the logical operator 110 detects a specified error state condition. The logical operator of NOT (the inverter) 330 of FIG. 3 is replaced by an XOR 430. An XOR, as is understood by those of skill in the art, gives a true value if both values are different, and a false value (value of zero) if both input values are the same In the context of FIG. 2, this means that the OR output is 0 for a specific predefined non-allowed state, and 1 for an allowed state or a non-specified non-allowed state. Then, this becomes the "gate" value into DFF2 220 flip flop.

In FIG. 4, when the gate value output by the OR gate 210 is "one", and the C value input is a "1", the output value is a "0", which means that the flip flop 220 is behaving like a prior art flip flop, and the XOR is behaving as an inverter. Similarly, if the gate value is "one" and the C value input is a "0", the output value is a "1", which means the XOR logical operator 430 is active as an inverter to the C value.

In FIG. 4, when the gate value is "zero", and the C value input is a "1", the XOR output value is a "1", which means that the flip flop 220 is not behaving like a prior art flip flop, and the same value for D is being propagated through both D1 latch 1 and D Latch 2. Similarly, if the gate value is "zero" and the C value input is a "0", the XOR output value is a "0", which is sent as a C input to D Latch2 420, and the previous states are stored in D1 latch 1 and D2 latch 2.

In other words, when the output of OR 210, the gate input to the XOR 430, is zero, the D latch 1 410 and the D Latch2 420 both have the same clock values within DFF 2 115. In the context of FIG. 2, this means when gate 3 of FIG. 4 is zero, for a negative clock pulse, the qint value still does not change. However, unlike the prior art, the Q output value does not change either. Therefore, the qint and the q value are both "locked," which is unlike FIG. 3, and the Q output value does not change.

Furthermore, if the input clock pulse is positive and the gate input is zero, the input D value propagates through both D latches 410, 420, through qint2 and then out through Q. Also, because the clock state is positive as input into DFF3 225, the qint of the third flip flop q3int is also equal to q2. In other words, D value becomes Q, which was not true in the prior art.

In other words, for a gate value of 0, and a positive clock cycle, the q1 value gets propagated to the qint2 value and the q2 output value, and the q3 int value. In the context of FIG. 1A, this means that instead of 00110000 becoming the unallowed state of 10011000, it becomes 10000000, thereby forcing from an undesired state to a desired state. Likewise, the state after 00110011, which would have been 00000100 0, is instead 00000001, as the q1 value gets propagated and copied through to q3int.

Figure 5:
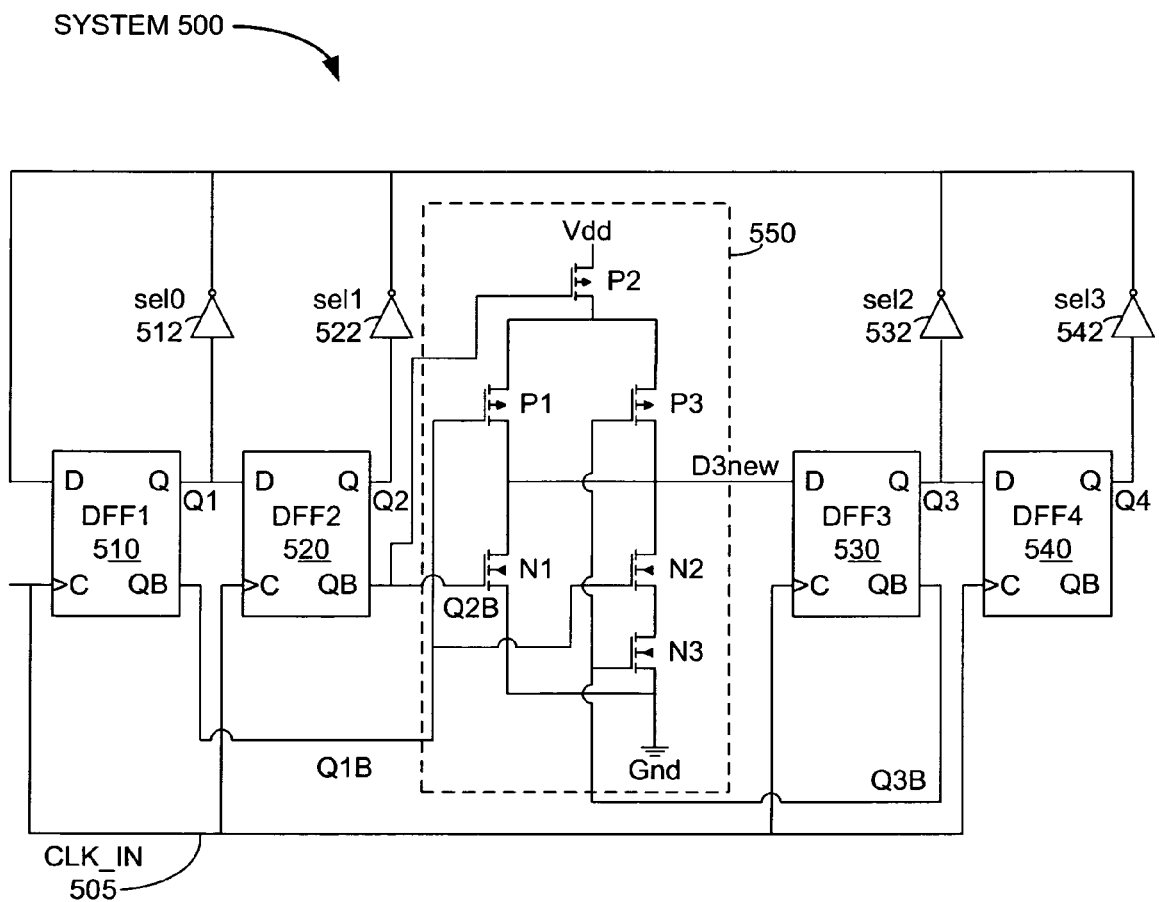
FIG. 5 illustrates an alternative embodiment of a divider circuit.

Turning now to FIG. 5, illustrated is an alternative embodiment of a divider circuit 500. A D type flip flop (DFF) 1 510 has a clock signal input into its C input. The Q output of DFF1 510 (q1 signal state) is coupled to the D input of a DFF2 520. The Q output of DFF2 520 (q2 signal state) is coupled to a circuit 550. The output of the circuit 550 is coupled to the D input of a DFF3 530. The Q output of DFF3 530 (q3 signal state) is coupled to the D input of a DFF4 540. The outputs q1, q2, q3 and q4 can be selected by selectors 512, 522, 532, 542, thereby configuring the circuit 500 as a divide by 2, 4, 6 or 8 correction circuit.

A divider correction circuit 550 is coupled between the inverted output of DFF2 520 (q2b) and the data input into DFF3 530. As is understood by those of skill in the art, the voltage produced by a CMOS circuit is a function of a supply voltage, and which transistors of the CMOS circuit are turned on and off. Correction circuit 550 is one embodiment of logic implementing the truth table of Table 1 below.

TABLE 1

Truth Table for Correction Circuit 550.

| Q1b | Q2b | Q3b | D3new |
|-----|-----|-----|-------|
| 0 | 0 | 0 | 1 |
| 0 | 0 | 1 | 1 |
| 0 | 1 | 0 | 0 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

In the above truth table, q1b (inverted output of DFF1 510) is employed, Q2b (inverted output of DFF2 520) is employed, and q3b (inverted output of DFF3 530) is employed. In FIG. 5, the circuit 550 is coupled between the inverted output of Q2b and the data input into D3, thereby creating the D3new value. The circuit 550 can work substantially as follows.

In the system 500, q1B (inverted) value, the q2b (inverted) value, and the q3b (inverted) value are input into the circuit 550. If q1b is a zero, D3new equals the opposite of q2B. The state of q3 or q3b is not a factor in the above truth table.

However, if q1b equals a one, and if q2b equals a zero, and if q3b equals zero, then D3new is set to equal one. Hence, error correction arises.

Furthermore, there is no state among the desired states that would create a "skip" to an undesired state. For instance, if q1 and q3 equal zero of a desired state, this would be x0x xx0xx By definition of the truth table of FIG. 5, this would then become x0x0x0xx or x0x1x1x0xx. In other words, if q1 and q2 are zero, then q2 is automatically zero, so in other words, there is no state that creates a problem.

As is understood by those of skill the art, the voltage across the drain and source of a CMOS circuit is a function of overall function of the circuit and whether the circuit is turned on or off. In 550, this is one embodiment of logic corresponding to the following truth table. The truth table represents two conditions wherein Q1 does not equal D2new.

In the system 500, we are using q1B (inverted) value, and the q3b (inverted) value, so there is an actual change of state when q1b equals D3new. This occurs when q0 is 0 and q3 is 0. Therefore, the next value input into the next flip-flop after this is also zero, and both q3 and qint3 becomes 0 instead of 1, the value of Q1. In FIG. 1, this correlates to 0 0011001 becomes 00000001 and 10011000 becoming 100 00000. In other words, for the q1 and q3 output values of 1, q3 int becomes zero.

Furthermore, there is no state among the desired states that would create a "skip" to an undesired state. For instance, if q1 and q3 equal zero in a desired state, this would be x00x xx0xx By definition of the truth table of FIG. 5, this would then become x0x0x0xx. By the type of frequency division that is done in this graph, if q1 and q3 are zero, then q2 has to be zero, in the desired states. Therefore, there is no state that creates a problem.

Figure 6:
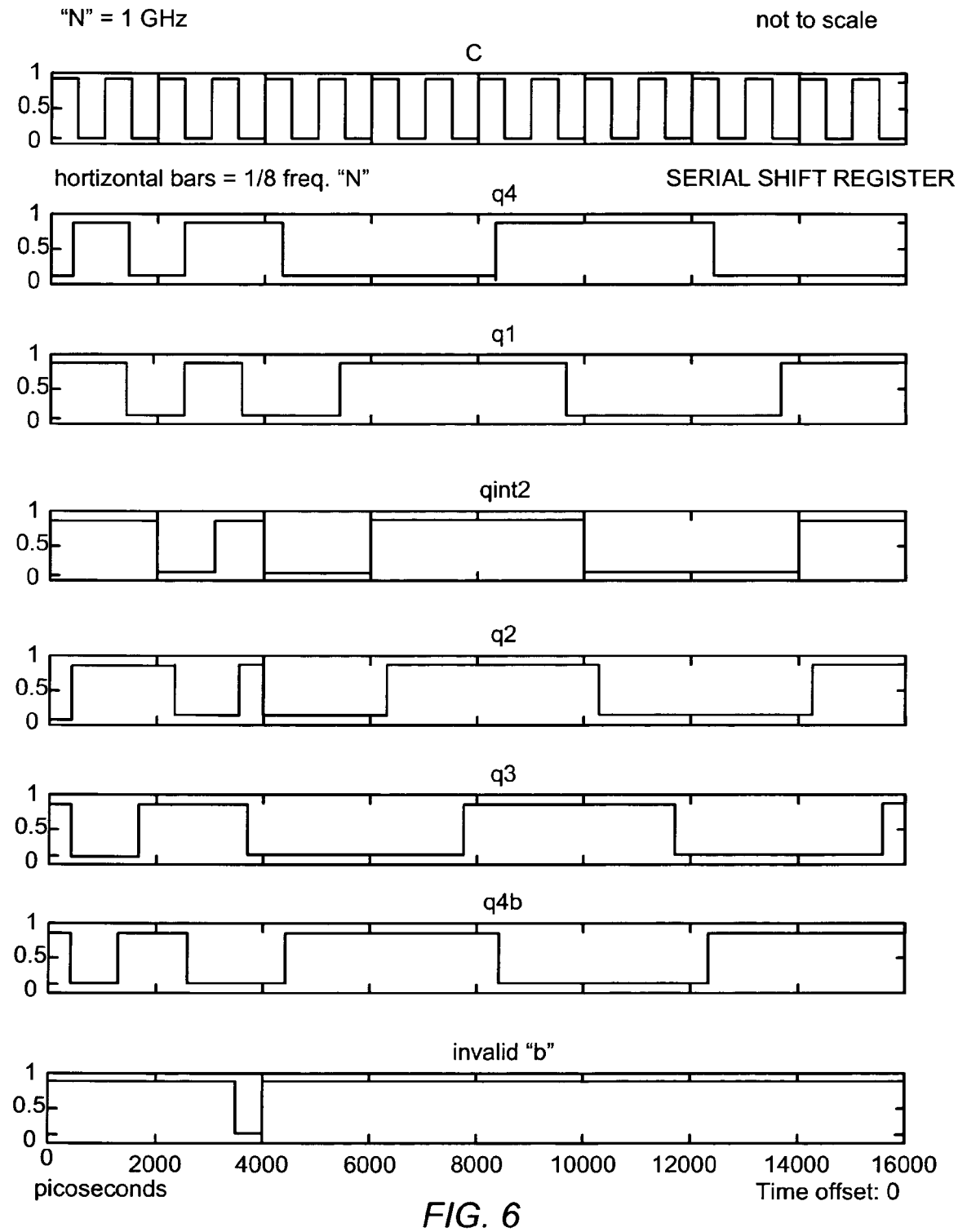
FIG. 6 illustrates various timing diagrams of external and internal states of the flip flops of FIG. 2.

Turning now to FIG. 6, illustrated are simulated waveform diagram of the operation of the diagram. As is illustrated, even if a q1 to q4 waveform starts out in an incorrect state, it transitions into a correct sequence of 1s and 0 s after a few clock transitions.

It is understood that the present invention can take many forms and embodiments. Accordingly, several variations may be made in the foregoing without departing from the spirit or the scope of the invention. The capabilities outlined herein allow for the possibility of a variety of programming models. This disclosure should not be read as preferring any particular programming model, but is instead directed to the underlying mechanisms on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A state circuit, comprising:
a first flip flop coupled to receive a first feedback signal and a clock signal, and configured to produce a first output signal and an inverted version of the first output signal dependent upon the first feedback signal and the clock signal;

a second flip flop coupled to receive the first output signal and the clock signal, and configured to produce a second output signal and an inverted version of the second output signal dependent upon the first output signal and the clock signal;

a state correction circuit coupled to receive the inverted versions of the first and second output signals and a second feedback signal, and configured to produce a third output signal dependent upon the inverted versions of the first and second output signals and the second feedback signal;

a third flip flop coupled to receive the third output signal and the clock signal, and configured to produce a fourth output signal, and an inverted version of the fourth output signal as the second feedback signal, dependent upon the third output signal and the clock signal;

a fourth flip flop coupled to receive the fourth output signal and the clock signal, and configured to produce a fifth output signal dependent upon the fourth output signal and the clock signal; and wherein the state circuit is configured to produce an output signal having a frequency that is less than a frequency of the clock signal.

2. The state circuit of claim 1, wherein the state correction circuit is configured to produce the third output signal such that the third output signal is the logical inverse of the inverted version of the second output signal when the state circuit is at a predefined state.

3. The state circuit of claim 1, wherein the state circuit is a divide by six frequency divider state circuit.

4. The state circuit of claim 1, wherein the state circuit is a divide by eight frequency divider state circuit.

5. The state circuit of claim 1, wherein at least one of the first, second, third, and fourth flip flops is a D type flip flop.

6. The state circuit of claim 1, wherein the first feedback signal is produced by a flip flop of the state circuit.

7. The state circuit of claim 1, wherein the first feedback signal is produced by the fourth flip flop.

8. The state circuit of claim 1, wherein the state circuit is employed in a processing unit.

9. The state circuit of claim 8, wherein the processing unit is employed in a computer or an electronic data processor.

10. The state circuit of claim 1, wherein the state correction circuit comprises a CMOS circuit.

11. The state circuit of claim 1, wherein the state correction circuit comprises a plurality of P-type transistors and N-type transistors.

12. The state circuit of claim 1, wherein the first feedback signal is produced by the third flip flop.

13. The state circuit of claim 1, further comprising:
a first selector coupled to receive the fourth output signal; and
a second selector coupled to receive the fifth output signal.

14. The state circuit of claim 13, wherein the first selector is configured to produce the first feedback signal when enabled, and when the first selector is enabled, the state circuit forms a divide by six frequency divider state circuit.

15. The state circuit of claim 13, wherein the second selector is configured to produce the first feedback signal when enabled, and when the second selector is enabled, the state circuit forms a divide by eight frequency divider state circuit.

16. The state circuit of claim 1, further comprising selection logic coupled to receive the first, second, fourth, and fifth output signals, and configured to produce an inverted version of either the first output signal, the second output signal, the fourth output signal, or the fifth output signal as the first feedback signal.

17. The state circuit of claim 1, wherein in the event the inverted version of the first output signal is a logic 0, the state correction circuit is configured to produce the third output signal such that the third output signal is the logical inverse of the inverted version of the second output signal.

18. The state circuit of claim 1, wherein in the event the inverted version of the first output signal is a logic 1 and the inverted version of the second output signal is a logic 0, the state correction circuit is configured to produce the third output signal such that the third output signal is the logical inverse of the second feedback signal.

19. The state circuit of claim 1, wherein in the event the inverted versions of the first and second output signals are a logic 1, the state correction circuit is configured to produce the third output signal such that the third output signal is a logic 0.

20. A method for state correction in an electronic data processing system employing at least one processing unit comprising:

implementing a state circuit for state correction within the at least one processing unit, wherein the implementing step further comprises:

connecting an output of a first flip flop to a second flip flop, wherein the first flip flop is coupled to receive a first feedback signal and a clock signal, and configured to produce a first output signal and an inverted version of the first output signal dependent upon the first feedback signal and the clock signal, and wherein the second flip flop is coupled to receive the first output signal and the clock signal, and configured to produce a second output signal and an inverted version of the second output signal dependent upon the first output signal and the clock signal;

connecting an output of the second flip flop to a state correction circuit, wherein the state correction circuit is coupled to receive the inverted versions of the first and second output signals and a second feedback signal, and configured to produce a third output signal dependent upon the inverted versions of the first and second output signals and the second feedback signal;

connecting an output of the state correction circuit to a third flip flop, wherein the third flip flop is coupled to receive the third output signal and the clock signal, and configured to produce a fourth output signal, and an inverted version of the fourth output signal as the second feedback signal, dependent upon the third output signal and the clock signal; and connecting an output of the third flip flop to a fourth flip flop, wherein the fourth flip flop is coupled to receive the fourth output signal and the clock signal, and configured to produce a fifth output signal dependent upon the fourth output signal and the clock signal.

* * * * *